(12) United States Patent
Kim et al.

(10) Patent No.: US 9,171,872 B2
(45) Date of Patent: Oct. 27, 2015

(54) METHOD OF MANUFACTURING AN OFFSET PRINTING SUBSTRATE AND METHOD OF MANUFACTURING A DISPLAY SUBSTRATE USING THE SAME

(75) Inventors: Kyu-Young Kim, Suwon-si (KR); Youn-Gu Lee, Suwon-si (KR); Dae-Young Lee, Suwon-si (KR); Nam-Ok Jung, Suwon-si (KR)

(73) Assignee: SAMSUNG ELECTRONICS CO., LTD. (KR)

(*) Notice: Subject to any disclaimer, the term of this patent is extended or adjusted under 35 U.S.C. 154(b) by 559 days.

(21) Appl. No.: 13/559,483

(22) Filed: Jul. 26, 2012

(65) Prior Publication Data

US 2013/0034657 A1 Feb. 7, 2013

(30) Foreign Application Priority Data

Aug. 4, 2011 (KR) .................. 10-2011-0077625

(51) Int. Cl.
*B41F 3/36* (2006.01)
*B05D 5/00* (2006.01)
*B41M 1/10* (2006.01)
*H01L 27/12* (2006.01)
*B41N 1/06* (2006.01)

(52) U.S. Cl.
CPC ............. *H01L 27/1292* (2013.01); *B41M 1/10* (2013.01); *B41N 1/06* (2013.01)

(58) Field of Classification Search
CPC ......... H01L 27/1292; B41N 1/06; B41N 1/00
USPC ....................................... 101/401.1
See application file for complete search history.

(56) References Cited

U.S. PATENT DOCUMENTS

| | | | | |
|---|---|---|---|---|
| 6,732,643 | B2* | 5/2004 | Kwon et al. | 101/170 |
| 6,940,578 | B2* | 9/2005 | Baek et al. | 349/187 |
| 7,117,790 | B2* | 10/2006 | Kendale et al. | 101/327 |
| 8,291,820 | B2* | 10/2012 | Nomoto | 101/153 |
| 2008/0236425 | A1* | 10/2008 | Takamatsu | 101/453 |
| 2011/0107927 | A1* | 5/2011 | Lee et al. | 101/158 |
| 2011/0174176 | A1* | 7/2011 | Chun et al. | 101/401.1 |
| 2012/0125213 | A1* | 5/2012 | Koo et al. | 101/395 |

* cited by examiner

*Primary Examiner* — Cachet Sellman
(74) *Attorney, Agent, or Firm* — Innovation Counsel LLP (57) ABSTRACT

In a method of manufacturing an offset printing substrate and a method of manufacturing a display substrate, the method includes forming a first coating layer on a base substrate on which is formed a first concave pattern having a first width. An intermediate substrate is also formed upon the first coating layer of the base substrate, the intermediate substrate having a pattern corresponding to the first concave pattern. An offset printing substrate is also formed upon the pattern of the intermediate substrate, the offset printing substrate having a second concave pattern is formed to correspond to the pattern of the intermediate substrate, and the second concave pattern has a second width smaller than the first width.

16 Claims, 10 Drawing Sheets

METHOD OF MANUFACTURING AN OFFSET PRINTING SUBSTRATE AND METHOD OF MANUFACTURING A DISPLAY SUBSTRATE USING THE SAME

CROSS-REFERENCE TO RELATED APPLICATION

This application claims priority to Korean Patent Application No. 2011-0077625, filed on Aug. 4, 2011, and all the benefits accruing therefrom under 35 U.S.C. §119, the content of which in its entirety is herein incorporated by reference.

BACKGROUND OF THE INVENTION

1. Field of the Invention

Example embodiments of the present invention relate generally to a method of manufacturing an offset printing substrate and a method of manufacturing a corresponding display substrate. More particularly, example embodiments of the present invention relate to a method of manufacturing an offset printing substrate used for forming a fine pattern and a method of manufacturing a corresponding display substrate.

2. Description of the Related Art

An offset printing may be used for forming a pattern on a substrate, and may employ a cliché and a blanket. The cliché is a substrate having a concave pattern. The blanket includes an elastic material and functions as an intermediate layer between the cliché and the substrate.

Two types of offset printing are gravure offset printing and reverse offset printing. In gravure offset printing, an ink is inserted into the concave pattern of the cliché, the cliché is contacted with, or pressed against, the blanket to transfer the ink onto the blanket, and the ink on the blanket is then transferred onto the substrate to form the pattern. In reverse offset printing, the ink is coated on the blanket, the blanket is pressed against the cliché to transfer the ink onto the non-concave portions of the cliché, and the ink remaining on the blanket is transferred onto the substrate again to form the pattern.

A cliché having a concave pattern is thus used in both gravure offset printing and reverse offset printing. The pattern is formed on the substrate according to the shape of the concave pattern of the cliché. For example, a width of the pattern formed on the substrate depends on that of the concave pattern of the cliché.

The cliché may be etched using a photo-resist pattern to form the concave pattern on the cliché. However, in etching the cliché, both those parts of the cliché corresponding to exposed photo-resist pattern and those adjacent to the exposed photo-resist pattern may be etched, and thus the concave pattern of the cliché may have a width larger than intended.

BRIEF SUMMARY OF THE INVENTION

Exemplary embodiments of the present invention provide a method of manufacturing an offset printing substrate capable of capable of forming a fine pattern.

Exemplary embodiments of the present invention also provide a method of manufacturing a display substrate using the offset printing substrate.

In an exemplary method of manufacturing an offset printing substrate according to the present invention, a first coating layer is formed on a base substrate on which a first concave pattern having a first width is formed. An intermediate substrate is formed upon the first coating layer of the base substrate, so as to have a pattern corresponding to the first concave pattern. An offset printing substrate is then formed upon the pattern of the intermediate substrate, so as to have a second concave pattern. The second concave pattern has a second width smaller than the first width.

In an exemplary embodiment, in the method, a first intermediate substrate is formed upon the first coating layer of the base substrate, so as to form a convex pattern on the first intermediate substrate, the convex pattern corresponding to the first concave pattern. A second intermediate substrate is also formed upon the convex pattern of the first intermediate substrate, so as to form a third concave pattern on the second intermediate substrate, the third concave pattern corresponding to the convex pattern. The third concave pattern may have a third width smaller than the first width.

In an exemplary embodiment, forming the first intermediate substrate may further include coating a first high polymer on the first coating layer, and applying pressure to the first high polymer so as to harden the first high polymer. Forming the second intermediate substrate may further include coating a second high polymer on the first intermediate substrate, and applying pressure to the second high polymer so as to harden the second high polymer.

In an exemplary embodiment, forming the offset printing substrate may further include forming a second coating layer on the second intermediate substrate, so as to form a second concave pattern having the second width smaller than the third width.

In an exemplary embodiment, the second coating layer may include one of silicon oxide ($SiO_2$) and nickel (Ni).

In an exemplary embodiment, the forming of the first coating layer may further include depositing one of oxide, nitride and metallic material.

In an exemplary embodiment, the forming of the first coating layer may further include depositing silicon nitride ($SiN_x$).

In an exemplary method of manufacturing a display substrate, a first coating layer is formed on a first base substrate on which a first concave pattern having a first width is formed. An intermediate substrate is formed upon the first coating layer of the base substrate, the intermediate substrate having a pattern corresponding to the first concave pattern. An offset printing substrate is formed upon the pattern of the intermediate substrate, the offset printing substrate having a second concave pattern corresponding to the pattern of the intermediate substrate. The second concave pattern has a width smaller than the first width. A signal line is formed on a second base substrate, by using the offset printing substrate, where the signal line corresponds to the second concave pattern. A pixel electrode is formed to be electrically connected to the signal line.

In an exemplary embodiment, forming the signal line may further include forming a first signal pattern on a blanket by using the offset printing substrate, the first signal pattern corresponding to the second concave pattern and extending along a first direction on the blanket. The process may also include transferring the first signal pattern onto the second base substrate so as to form the first signal line.

In an exemplary embodiment, forming the first signal pattern may further include coating a first metallic material on a surface of the blanket, and pressing the surface of the blanket on which the first metallic material is coated against the offset printing substrate, so that a portion of the first metallic material contacts portions of the offset printing substrate besides the second concave pattern (that is, only those parts of the offset printing substrate that are not part of the second concave pattern are contacted). The process may also include transferring the portion of the first metallic material onto the offset printing substrate.

In an exemplary embodiment, forming the first signal pattern may further include injecting a first metallic material into the second concave pattern, pressing the blanket against the offset printing substrate, and transferring the first metallic material onto the blanket.

In an exemplary embodiment, forming the signal line may further include forming a second signal pattern on the blanket by using the offset printing substrate, and transferring the second signal pattern onto the second base substrate so as to form the second signal line. The second signal pattern may correspond to the second concave pattern and may extend along a second direction crossing the first direction.

In an exemplary embodiment, forming the second signal pattern may further include coating a second metallic material on a surface of the blanket, and pressing the blanket on which the second metallic material is coated against the offset printing substrate, so that a portion of the second metallic material contacts portions of the offset printing substrate besides the second concave pattern. The process may also include transferring the portion of the second metallic material onto the offset printing substrate.

In an exemplary embodiment, forming the second signal pattern may further include injecting a second metallic material into the second concave pattern, pressing the blanket against the offset printing substrate, and transferring the second metallic material onto the blanket.

In an exemplary embodiment, forming the intermediate substrate may further include forming a first intermediate substrate upon the first coating layer of the base substrate, so as to form a convex pattern on the first intermediate substrate, the convex pattern corresponding to the first concave pattern. The process may also include forming a second intermediate substrate upon the convex pattern of the first intermediate substrate, so as to form a third concave pattern on the second intermediate substrate, the third concave pattern corresponding to the convex pattern. The third concave pattern may have a third width smaller than the first width.

In an exemplary embodiment, forming the offset printing substrate may further include forming a second coating layer on the second intermediate substrate, so as to form a second concave pattern having the second width smaller than the third width.

According to exemplary embodiments of the present invention, an additional offset printing substrate in addition to a cliché is manufactured, so the cliché need not be formed in every process. Thus, for the cost of manufacturing the cliché may be reduced.

In addition, a coating layer having a substantially uniform thickness is formed on the first concave pattern of the cliché so as to form a second concave pattern, thus decreasing a width of the concave pattern.

In addition, a first intermediate substrate is manufactured using a high polymer on the coating layer, a second intermediate substrate having a third concave pattern is manufactured using a high polymer on the first intermediate substrate, and a coating layer having a substantially uniform thickness is formed on the second intermediate substrate, so that the width of the concave pattern may be further reduced.

In addition, a width of the coating layer is controlled so as to change the width of the concave pattern.

BRIEF DESCRIPTION OF THE DRAWINGS

The above and other features and advantages of the present invention will become more apparent by describing in detailed exemplary embodiments thereof with reference to the accompanying drawings, in which.

DETAILED DESCRIPTION OF THE INVENTION

Hereinafter, exemplary embodiments of the present invention will be described in further detail with reference to the accompanying drawings.

FIGS. 1A, 1B, 1C, 1D, 1E, 1F and 1G are cross-sectional views illustrating a method of manufacturing an offset printing substrate according to an example embodiment of the present invention.

Figure 1A:
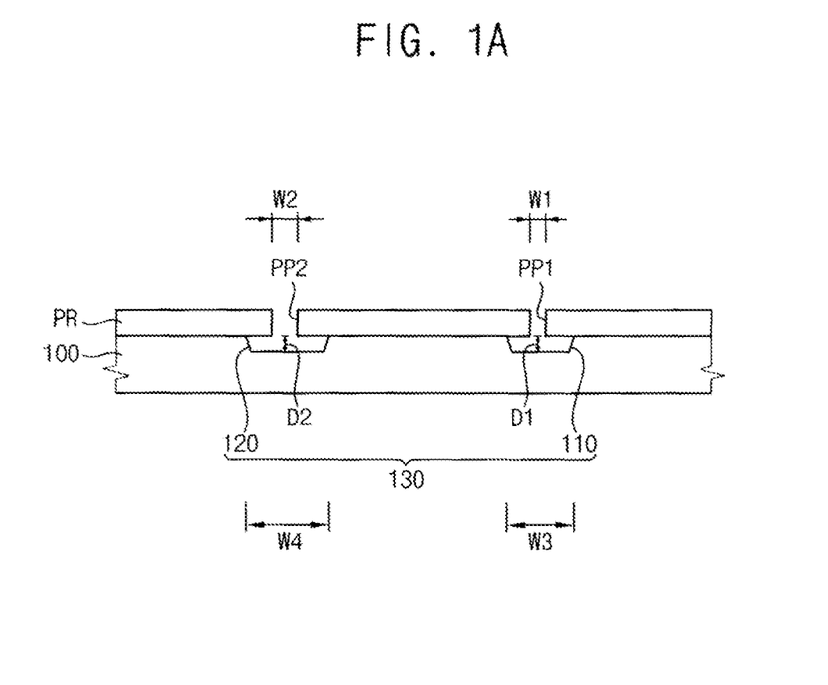
FIGS. 1A, 1B, 1C, 1D, 1E, 1F and 1G are cross-sectional views illustrating a method of manufacturing an offset printing substrate according to an example embodiment of the present invention.

Referring to FIG. 1A, a first concave pattern 130 is formed on a first base substrate 100 to form a fine pattern. For example, a photo-resist layer PR is formed on the first base substrate 100, and the photo-resist layer PR is patterned to form a photo-pattern PP for forming the first concave pattern 130.

The first base substrate 100 is a cliché substrate. The photo-pattern PP may include a first photo-pattern portion PP1 having a first width W1 and a second photo-pattern portion PP2 having a second width W2. As one example, the first width W1 is smaller than the second width W2, although this need not necessarily be the case. The first base substrate 100 is partially etched through the first photo-pattern portion PP1 to form a first concave pattern portion 110. Additionally, the first base substrate 100 is partially etched through the second photo-pattern portion PP2 to form a second concave pattern portion 120. The first concave pattern portion 110 is formed with a third width W3 larger than the first width W1 due to the specific etching effect. Similarly, the second concave pattern portion 120 is formed with a fourth width W4 larger than the second width W2 due to the specific etching effect.

Thus, as above, the area of the first base substrate 100 adjacent to an area overlapping with the first photo-pattern portion PP1 is also etched to form the first concave pattern portion 110 with the third width W3 larger than the first width W1. For example, the third width W3 may be a sum of the first width W1 and a skew length. The length of the skew may be similar to a first depth D1 of the first concave pattern portion 110. The area of the first base substrate 100 adjacent to an area overlapping with the second photo-pattern portion PP2 is also etched to form the second concave pattern portion 210 with the fourth width W4 larger than the second width W2. For example, the fourth width W4 may be a sum of the second width W2 and a length of a skew. The length of the skew may be similar to a second depth D2 of the second concave pattern portion 210. The second depth D2 may be similar to the first depth D1.

The first and second concave pattern portions 110 and 120 are formed on the first base substrate 100, and then the photo-resist layer PR is removed.

Figure 1B:
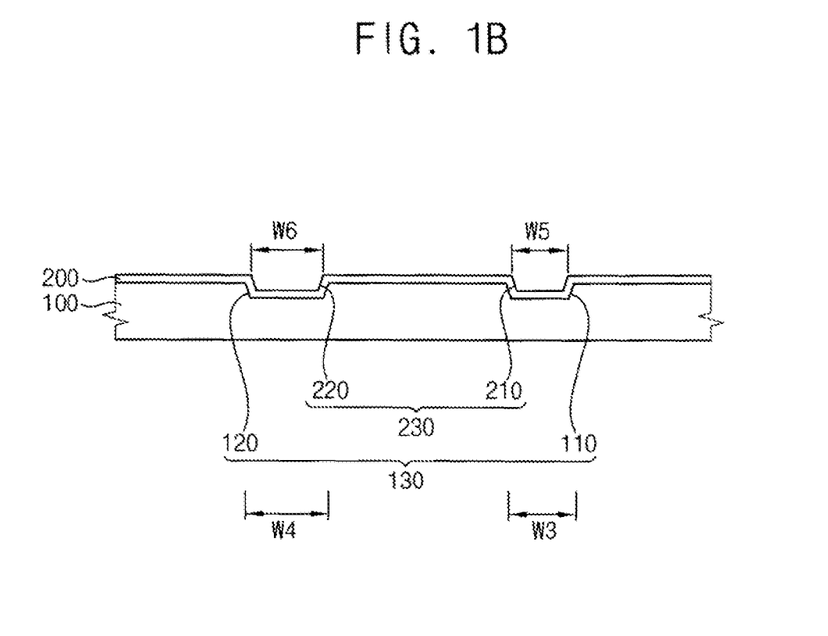

Referring to FIG. 1B, a first coating layer 200 is then formed on the first base substrate 100, using chemical vapor deposition (CVD). A second concave pattern 230 is thus formed to correspond to the first concave pattern 130. The second concave pattern 230 may include a third concave pattern portion 210 corresponding to the first concave pattern portion 110, and a fourth concave pattern portion 220 corresponding to the second concave pattern portion 120. One of oxide, nitride and metallic material is deposited to form the first coating layer. For example, the first coating layer 200 may include one of silicon oxide (SiO2), silicon nitride (SiNx), diamond like carbon (SL2C), chromium (Cr), molybdenum (Mo) and nickel (Ni).

When the first coating layer 200 includes silicon nitride (SiNx), the first coating layer 200 may be substantially uniformly deposited on the first base substrate 100 with a first thickness. The first thickness may be in a range between about 1000 Å and about 1 μm. When the first coating layer 200 has the first thickness of about 1000 Å, the third concave pattern portion 210 has a fifth width W5 decreased by about 2000 Å from the third width W3, and the fourth concave pattern portion 220 has a sixth width W6 decreased by about 2000 Å from the fourth width W4. The fifth and sixth widths W5 and W6 of the third and fourth concave pattern portions 210 and 220 are decreased, but depths of the third and fourth concave pattern portions 210 and 220 are substantially the same as the first and second depths D1 and D2 of the first and second concave pattern portions 110 and 120, respectively.

Alternatively, when the first coating layer 200 has a first thickness of about 1 μm, the third concave pattern portion 210 may have a fifth width W5 decreased by about 2 μm from the third width W3, and the fourth concave pattern portion 220 may have a sixth width W6 decreased by about 2 μm from the fourth width W4.

Thus, based on the thickness of the first coating layer 200, each of the fifth and sixth widths W5 and W6 of the third and fourth concave pattern portions 210 and 220 may be decreased by between about 2000 Å and about 2 μm.

Figure 1C:
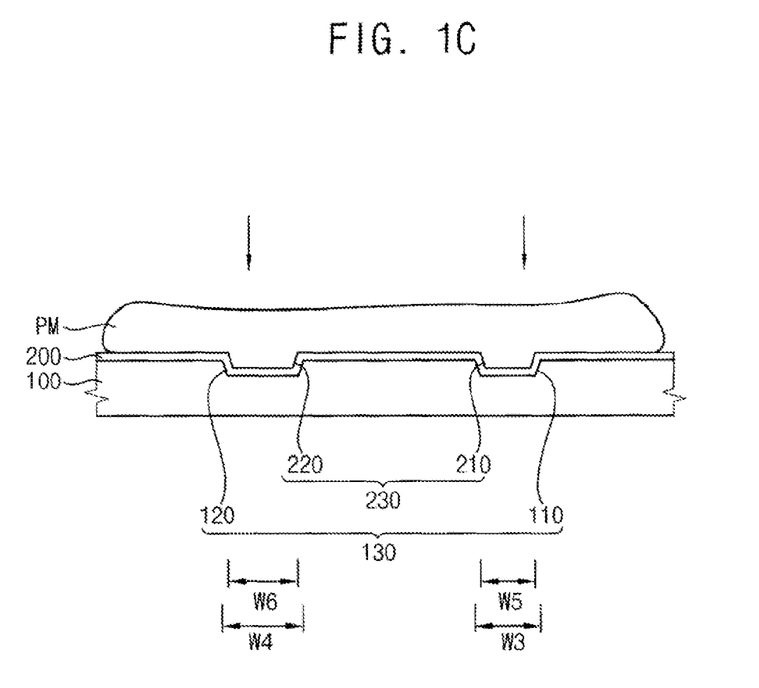
Figure 1D:
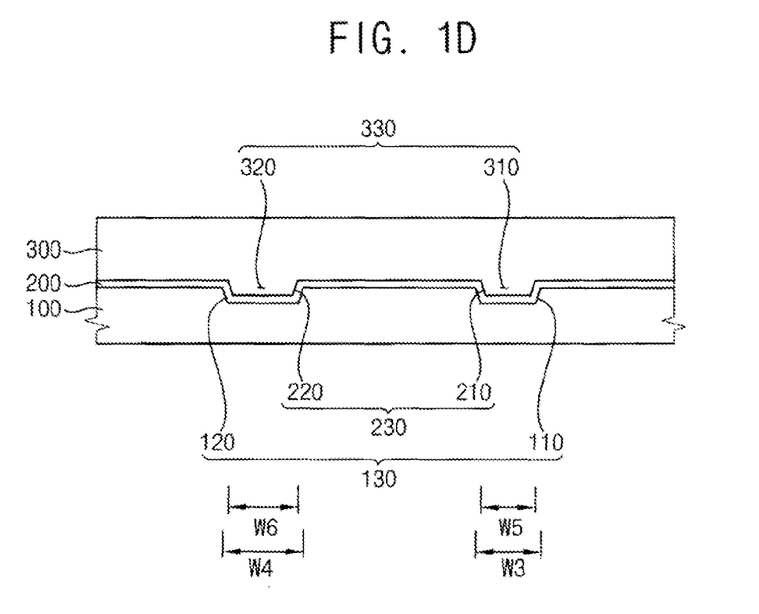

Referring to FIGS. 1C and 1D, a high polymer PM is coated on the first coating layer 200. The high polymer PM is pressurized toward the first coating layer 200 and is hardened, to form a first intermediate substrate 300 having a first convex pattern 330 corresponding to the third and fourth concave pattern portions 210 and 220 of the second concave pattern 230.

The first convex pattern 330 includes a first convex pattern portion 310 corresponding to the third concave pattern portion 210, and a second convex pattern portion 320 corresponding to the fourth concave pattern portion 220. Since the first intermediate substrate 300 is manufactured via a molding process, the first convex pattern portion 310 has a fifth width W5 substantially the same as the third concave pattern portion 210, and the second convex pattern portion 320 has a sixth width W6 substantially the same as the fourth concave pattern portion 220.

Figure 1E:
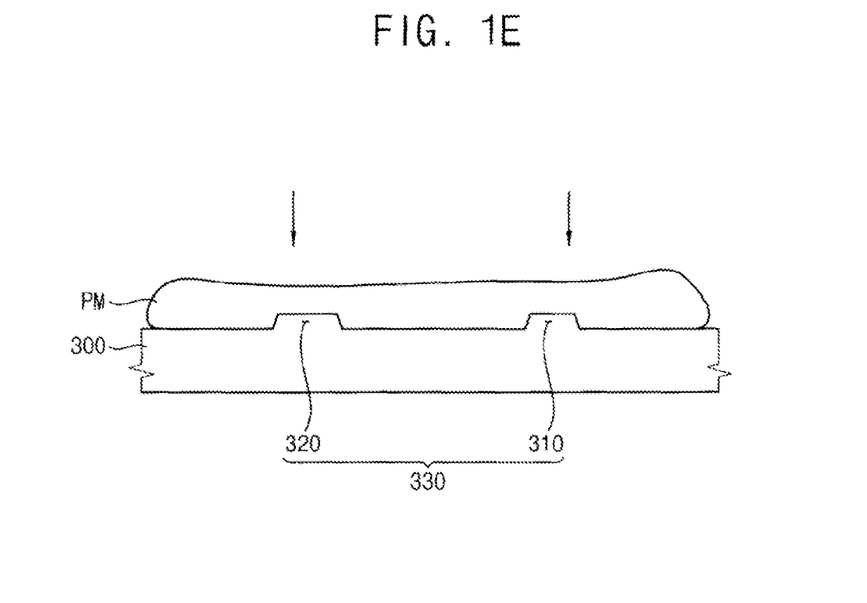
Figure 1F:
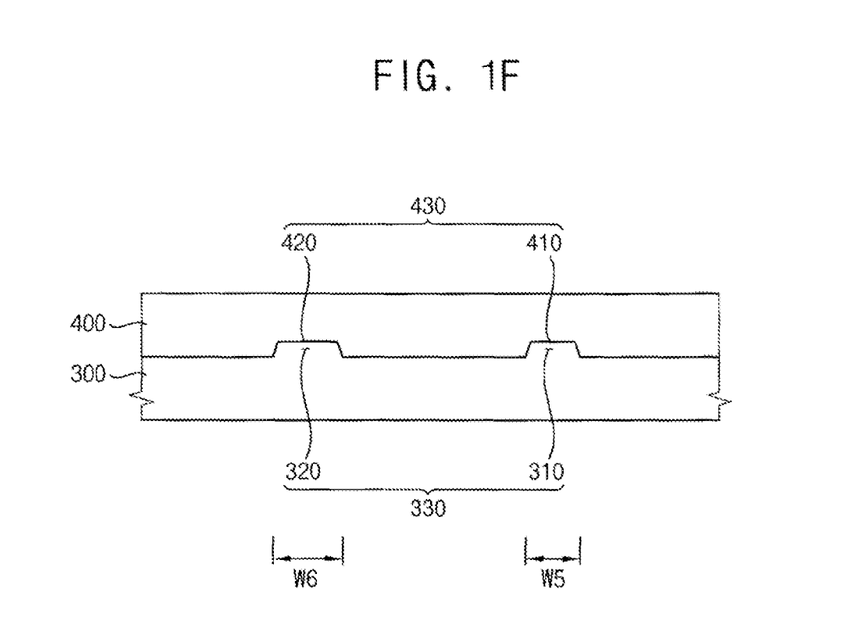

Referring to FIGS. 1E and 1F, the high polymer PM is next coated on the first intermediate substrate 300, and in particular over the first and second convex pattern portions 310 and 320. The high polymer PM is pressurized toward the first intermediate substrate 300 and is hardened, to form a second intermediate substrate 400 having a second concave pattern 430 corresponding to the first and second convex pattern portions 310 and 320.

The second concave pattern 430 includes a fifth concave pattern portion 410 corresponding to the first convex pattern portion 310, and a sixth concave pattern portion 420 corresponding to the second convex pattern portion 320. Since the second intermediate substrate 400 is manufactured via a molding process, the fifth concave pattern portion 410 has a fifth width W5 substantially the same as that of the first convex pattern portion 310, and the sixth concave pattern portion 420 has a sixth width W6 substantially the same as that of the second convex pattern portion 320.

Figure 1G:
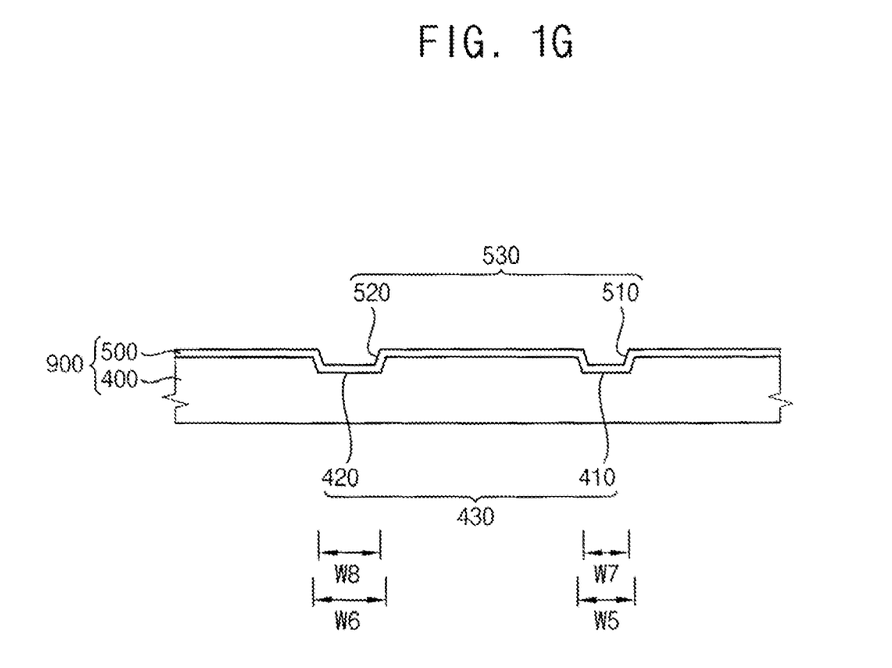

Referring to FIG. 1G, a second coating layer 500 is formed on the second intermediate substrate 400 over the third concave pattern 430. The second coating layer 500 can be formed using a process such as CVD, so as to form a first offset printing substrate 900. This process forms a fourth concave pattern 530 that corresponds to the third concave pattern 430. The fourth concave pattern 530 may include a seventh concave pattern portion 510 corresponding to the fifth concave pattern portion 410, and an eighth concave pattern portion 520 corresponding to the sixth concave pattern portion 420. One of oxide, nitride and metallic material may be deposited to form the second coating layer 500. For example, the second coating layer 500 may include one of silicon oxide (SiO2), silicon nitride (SiNx), diamond-like carbon (SL2C), chromium (Cr), molybdenum (Mo) and nickel (Ni).

When the second coating layer 500 includes silicon nitride (SiNx) or nickel (Ni), the first offset printing substrate 900 may have a relatively low surface energy similar to that of a glass substrate. Thus, the ink explained below may be easily detached from the surface of the first offset printing substrate 900. The second coating layer 500 may be uniformly deposited on the first intermediate substrate 400 to a first thickness. The first thickness may be in a range between about 1000 Å and about 1 μm.

When the second coating layer 500 has a first thickness of about 1000 Å, the seventh concave pattern portion 510 has a seventh width W7 decreased by about 2000 Å from that of the fifth width W5, and the eighth concave pattern portion 520 has an eighth width W8 decreased by about 2000 Å from that of the sixth width W6. The seventh and eighth widths W7 and W8 of the seventh and eighth concave pattern portions 510 and 520 are decreased, but depths of the seventh and eighth concave pattern portions 510 and 520 are substantially the same as the fifth and sixth depths of the fifth and sixth concave pattern portions 410 and 420, respectively.

Alternatively, when the first coating layer 200 has a first thickness of about 1 μm, the third concave pattern portion 210 may have a fifth width W5 decreased by about 2 μm from the third width W3, and the fourth concave pattern portion 220 may have a sixth width W6 decreased by about 2 μm from the fourth width W4.

Accordingly, the first offset printing substrate 900 having the seventh and eighth widths W7 and W8 is formed. The seventh and eighth widths W7 and W8 are smaller than the first and second widths W1 and W2 of the first and second concave pattern portions 110 and 120 of the first base substrate 100.

In addition, although not shown in the figure, a high polymer PM can be coated, pressurized and hardened onto the second coating layer 500, to form a third intermediate substrate having a second convex pattern corresponding to the fourth concave pattern 530. The high polymer PM can again be coated, pressurized and hardened onto the third intermediate substrate, to form a fourth intermediate substrate having a fifth concave pattern corresponding to the second convex pattern. A third coating layer can then be formed on the fourth intermediate substrate. Thus, a second offset printing substrate having a width smaller than that of the second concave pattern 530 can be formed. Accordingly, repeating the above-mentioned processes enough times, the width of the concave pattern may be repeatedly decreased, so as to eventually form a fine pattern. The invention contemplates any amount of repetition of the above process, so as to form fine patterns of any desired widths.

According to the present example embodiment in FIGS. 1A to 1G, the first offset printing substrate 900 having a second coating layer 500 is formed using the first base substrate 100. Thus, a pitch between the patterns formed on the first offset printing substrate 900 may be controlled.

Figure 2:
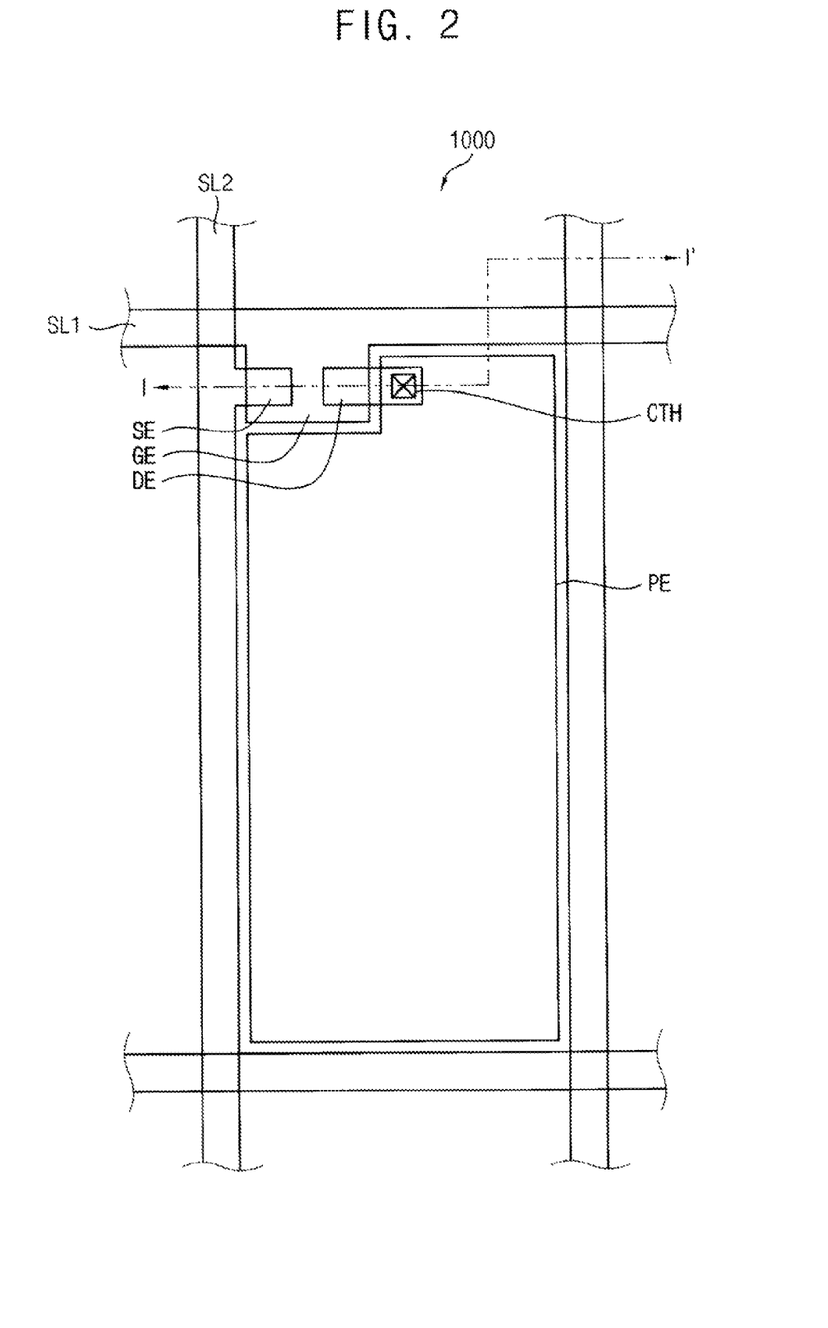
FIG. 2 is a plan view illustrating a display substrate according to another example embodiment of the present invention.
Figure 3:
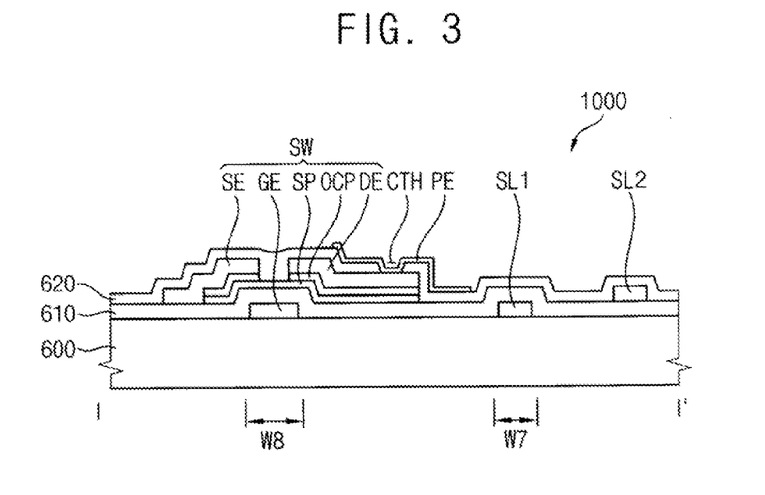
FIG. 3 is a cross-sectional view taken along a line I-I' of FIG. 2.

FIG. 2 is a plan view illustrating a display substrate according to another example embodiment of the present invention. FIG. 3 is a cross-sectional view taken along line I-I' of FIG. 2.

Referring to FIGS. 2 and 3, the display substrate 1000 includes a second base substrate 600, a plurality of first signal lines SL1, a plurality of second signal lines SL2, a plurality of switching elements SW, a pixel electrode PE, an insulating layer 610 and a protective layer 620.

The first signal lines SL1 extend along a first direction D1 on the second base substrate 600. The second signal lines SL2 extend along a second direction D2 crossing the first direction D1 on the second base substrate 600. Each of the switching elements SW includes a gate electrode GE, a source electrode SE, a drain electrode DE, a semiconductor pattern SP and an ohmic contact pattern OP. The gate electrode GE is electrically connected to the first signal line SL1, the source electrode SE is electrically connected to the second signal line SL1, and the drain electrode DE is spaced apart from the source electrode SE and electrically connected to the pixel electrode PE through a contact hole CTH. The semiconductor pattern SP forms a channel between the source electrode SE and the drain electrode DE, and the ohmic contact pattern OCP forms an ohmic contact between the semiconductor pattern SP and each of the source and drain electrodes SE and DE.

The insulating layer 610 is formed on the second base substrate 600 over the first signal line SL1 and the gate electrode GE, to protect the first signal line SL1 and the gate electrode GE. The insulating layer 610 insulates the second signal line SL2, the source electrode SE and the drain electrode DE from the first signal line SL1 and the gate electrode GE. The protective layer 620 is formed on the second base substrate 600 over the second signal line SL2, the source electrode SE and the drain electrode DE, so as to protect the second signal line SL2, the source electrode SE and the drain electrode DE. The contact hole CTH partially exposes the drain electrode DE, and is formed through the protective layer 620. The pixel electrode PE is electrically connected to the drain electrode DE through the contact hole CTH.

The display substrate 1000 may further include a first driver (not shown) driving the first signal line SL1 and a second driver (not shown) driving the second signal line SL2.

FIGS. 4A, 4B, 4C and 4D are cross-sectional views illustrating a method of manufacturing the display substrate of FIG. 2.

In the method according to the present example embodiment in FIGS. 4A to 4D, the display substrate is manufactured using the first offset printing substrate 900 illustrated in FIGS. 1A to 1G, and thus any repetitive explanation concerning the elements in the previous example embodiment will be largely omitted.

Figure 4A:
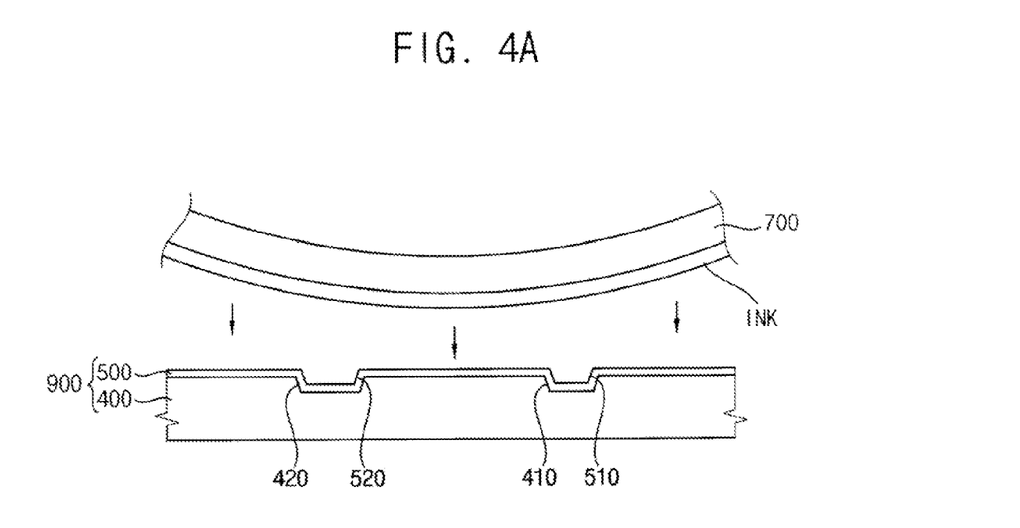
FIGS. 4A, 4B, 4C and 4D are cross-sectional views illustrating a method of manufacturing the display substrate of FIG. 2.

Referring to FIG. 4A, a blanket 700 on which an ink INK is coated is disposed over the first offset printing substrate 900 having second coating layer 500, which has been formed as illustrated in FIG. 1G. The ink INK faces the seventh and eighth concave pattern portions 510 and 520. The ink INK includes metallic material used for forming the first signal line SL1 and the gate electrode GE. As an example, the metallic material may include copper (Cu), titanium (Ti), molybdenum (Mo), aluminum (Al), etc. The blanket 700 includes an elastic material. The blanket 700 is pressurized toward, or pressed against, the offset printing substrate 400. Here, the ink INK overlapping the seventh and eighth concave pattern portions 510 and 520 does not contact the second coating layer 500, while the ink INK not overlapping the seventh and eighth concave pattern portions 510 and 520 contacts the second coating layer 500.

Figure 4B:
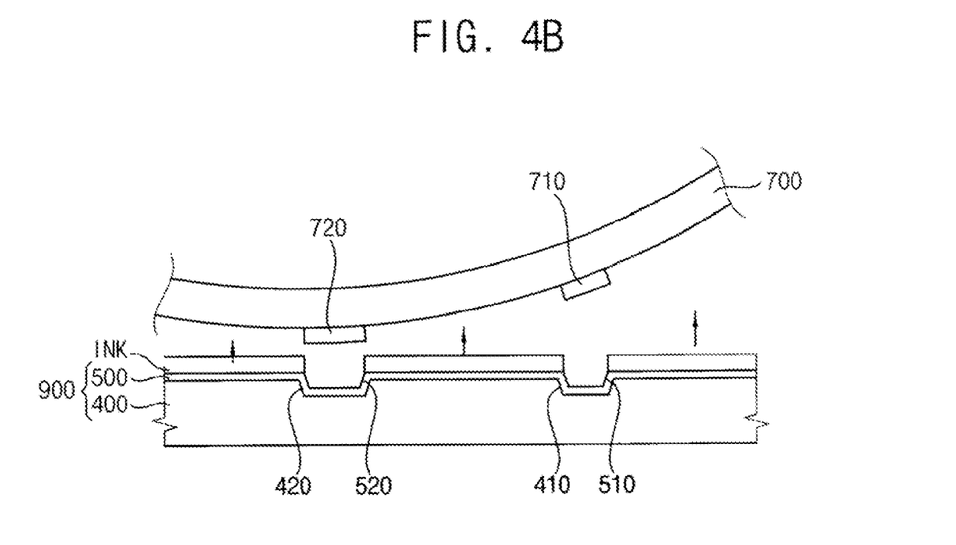

Referring to FIG. 4B, the blanket 700 is separated from the first offset printing substrate 900, thereby forming a first signal formed on the blanket 700. For example, the ink INK overlapping the seventh and eighth concave pattern portions 510 and 520 is not transferred onto the second coating layer 500, and the ink INK not overlapping the seventh and eight concave pattern portions 510 and 520 is transferred onto the second coating layer 500, so that the first signal pattern is formed on the blanket 700. The first signal pattern includes a first signal pattern portion 710 formed by the seventh concave pattern portion 510, and a second signal pattern portion 720 formed by the eighth concave pattern portion 520.

Figure 4C:
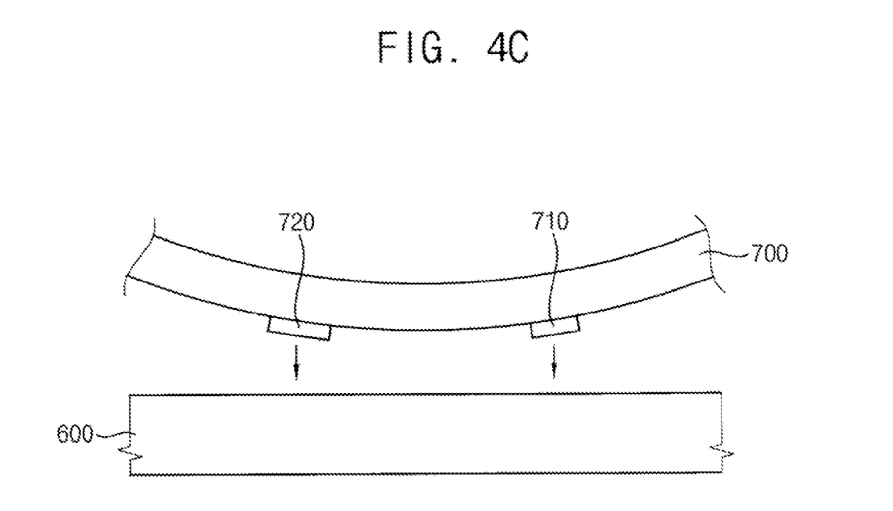

Referring to FIG. 4C, the first and second signal pattern portions 710 and 720 of the blanket 700 face the second base substrate 600, and the blanket 700 is pressurized toward the second base substrate 600.

Figure 4D:
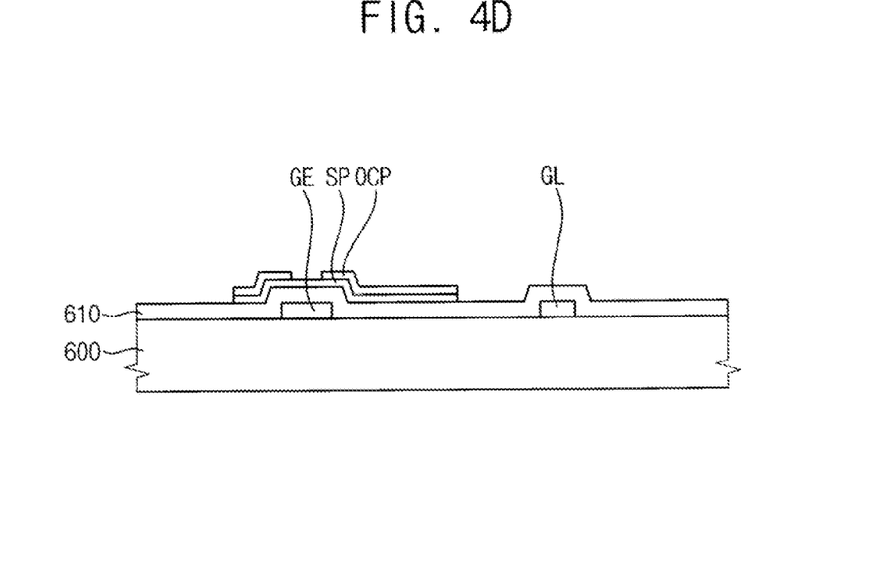

Referring to FIG. 4D, the first and second signal pattern portions 710 and 720 are transferred onto the second base substrate 600, to form the first signal line SL1 and the gate electrode GE on the second base substrate 600.

The insulating layer 610 is formed on the second base substrate 600 over the first signal line SL1 and the gate electrode GE, so as to cover the first signal line SL1 and the gate electrode GE. The semiconductor pattern SP and the ohmic contact pattern OP may be formed on the insulating layer 610 to overlap the gate electrode GE.

Referring to FIG. 3 again, the second signal line SL2 and the source and drain electrodes SE and DE (which are spaced apart from each other over the gate electrode GE) are formed on the second base substrate 200 over the semiconductor pattern SP and the ohmic contact pattern OCP. For example, the second signal line SL2, the source electrode SE and the drain electrode DE may be formed by a similar process as that described above, using the first offset printing substrate 900 having a second coating layer 500. Indeed, it should be noted that the process described in connection with FIGS. 1A-1G can be used to make a substrate 900 with pattern portions 510, 520 of any shape. In this manner, multiple substrates 900 can be fabricated, each shaped to form various individual conductive lines or structures as desired. A process for forming a display substrate can employ multiple such substrates 900 for multiple different layers of lines or structures, as desired.

The protective layer 620 is then formed on the base substrate 200 over the second signal line SL2, the source electrode SE and the drain electrode DE, and the contact hole CTH. The pixel electrode PE is subsequently formed on the protective layer 620, and the pixel electrode PE is electrically connected to the drain electrode DE through the contact hole CTH. For example, the pixel electrode PE may be formed using a version of the first offset printing substrate 900. Accordingly, the display substrate 1000 as illustrated in FIG. 2 may be manufactured.

The display substrate 1000 according to the present example embodiment as illustrated in FIG. 2 may have various other configurations, and the methods of the present example embodiment may be applied to the resulting display substrate in various ways, as described above.

According to the present example embodiment as illustrated in FIGS. 2 to 4D, a pitch of each of the first and second signal lines SL1 and SL2 may be controlled using the first offset printing substrate 900 having a second coating layer 500.

FIGS. 5A, 5B, 5C and 5D are cross-sectional views illustrating a method of manufacturing a display substrate according to still another example embodiment of the present invention.

In the method according to the present example embodiment in FIGS. 5A to 5D, the display substrate is manufactured using the first offset printing substrate 900 which is manufactured as in FIGS. 1A to 1G. Thus, further description of the previous example embodiment in FIGS. 1A to 1G will be largely omitted.

Figure 5A:
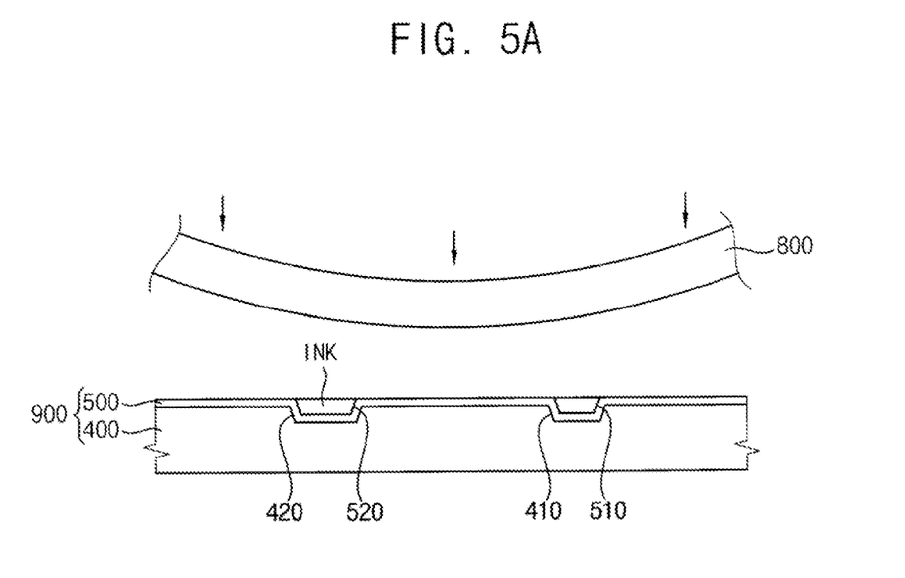
FIGS. 5A, 5B, 5C and 5D are cross-sectional views illustrating a method of manufacturing a display substrate according to still another example embodiment of the present invention.

Referring to FIG. 5A, the ink INK is injected into the seventh and eighth concave pattern portions 510 and 520 of the first offset printing substrate 900 in FIG. 1G. The ink INK includes a metallic material for forming the first signal line SL1 and the gate electrode GE. For example, the metallic material may include copper (Cu), titanium (Ti), molybdenum (Mo), aluminum (Al), etc. The blanket 800 is disposed over the first offset printing substrate 900 into which the ink INK is injected, and the blanket 800 is then pressurized toward, or pressed against, the first offset printing substrate 900. In this manner, the ink INK inside of the seventh and eighth concave pattern portions 510 and 520 makes contact with the blanket 800.

Figure 5B:
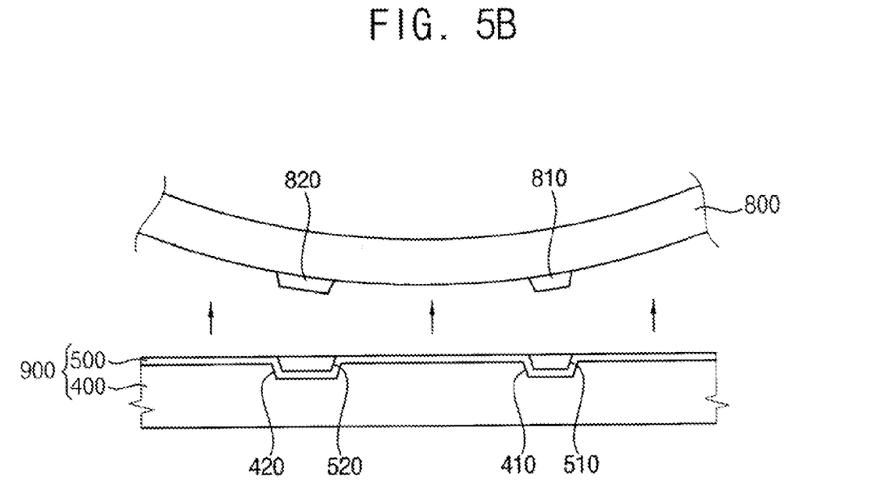

Referring to FIG. 5B, the blanket 800 is separated from the first offset printing substrate 900, and the ink INK adheres to the blanket 800 so that the first signal pattern is formed on the blanket 800. That is, the ink INK inside of the seventh and eighth concave pattern portions 510 and 520 is transferred onto the blanket 800, thus forming the first signal pattern on the blanket 800. The first signal pattern includes a first signal pattern portion 810 formed by the seventh concave pattern portions 510, and a second signal pattern portion 820 formed by the eighth concave pattern portion 520.

Figure 5C:
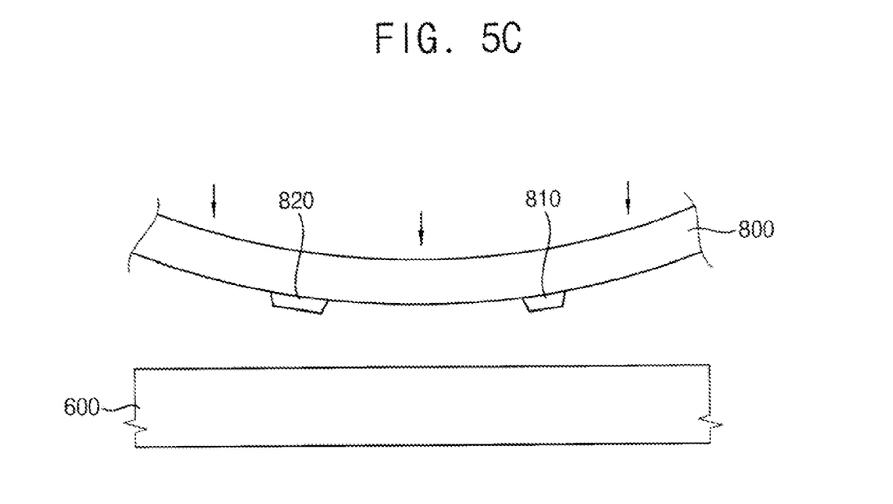

Referring to FIG. 5C, the first and second signal pattern portions 810 and 820 of the blanket 800 face the second base substrate 600, and the blanket 800 is pressurized toward the second base substrate 600.

Figure 5D:
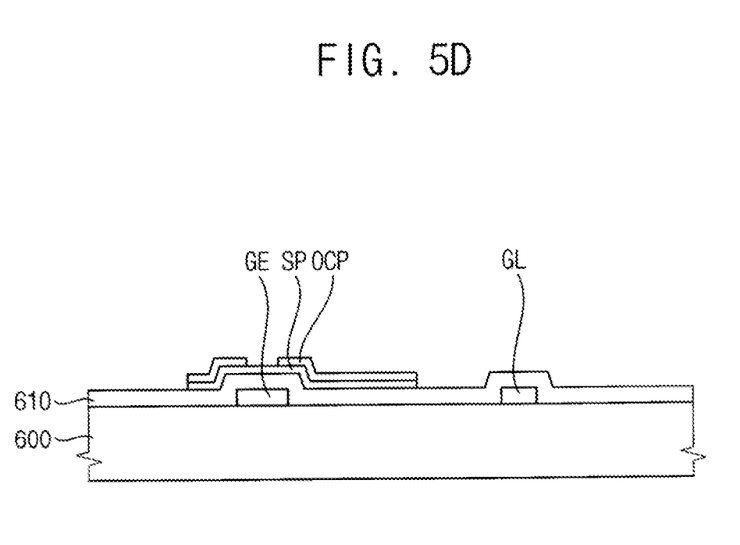

Referring to FIG. 5D, the first and second signal pattern portions 810 and 820 on the blanket 800 are transferred onto the second base substrate 600, thus forming the first signal line SL1 and the gate electrode GE on the second base substrate 600.

The insulating layer 610 is formed on the second base substrate 600 over the first signal line SL1 and the gate electrode GE, so as to cover the first signal line SL1 and the gate electrode GE. The semiconductor pattern SP and the ohmic contact pattern OP may then be formed on the insulating layer 610 to overlap the gate electrode GE.

Referring to FIG. 3 again, the second signal line SL2 and the source and drain electrodes SE and DE (which are spaced apart from each other over the gate electrode GE) are next formed on the second base substrate 200 over the semiconductor pattern SP and the ohmic contact pattern OP. As one example, the second signal line SL2, the source electrode SE and the drain electrode DE may be formed using a first offset printing substrate 900 having a second coating layer 500.

The protective layer 620 is formed on the base substrate 200 over the second signal line SL2, the source electrode SE and the drain electrode DE, and the contact hole CTH (which partially exposes the drain electrode DE through the protective layer 620). The pixel electrode PE is formed on the protective layer 620, and the pixel electrode PE is electrically connected to the drain electrode DE through the contact hole CTH. As an example, the pixel electrode PE may be formed using the first offset printing substrate 900. Accordingly, the display substrate 1000 as illustrated in FIG. 2 may be manufactured.

According to the present example embodiment as illustrated in FIG. 5A to 5D, a pitch of each of the first and second signal lines SL1 and SL2 may be controlled using the first offset printing substrate 900 having the second coating layer 500.

According to the example embodiments of the present invention, an additional offset printing substrate in addition to a cliché is manufactured, so that the cliché need not be formed in every process. Thus, the overall cost of the manufacturing process is reduced.

In addition, a coating layer having a substantially uniform thickness is formed on the cliché with a first concave pattern, so as to form a second concave pattern with a decreased width.

In addition, a first intermediate substrate is manufactured using a high polymer on the coating layer, a second intermediate substrate having a third concave pattern is manufactured using a high polymer on the first intermediate substrate, and a coating layer having a substantially uniform thickness is formed on the second intermediate substrate, so that the width of the concave pattern may be further decreased.

In addition, a width of the coating layer is controlled to change the width of the concave pattern.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific example embodiments disclosed, and that modifies to the disclosed example embodiments, as well as other example embodiments, are intended to be included within the scope of the appended claims. The present invention is defined by the following claims, with equivalents of the claims to be included therein.

What is claimed is:

1. A method of manufacturing an offset printing substrate, the method comprising:

forming a first coating layer on a base substrate on which is formed a first concave pattern having a first width;

forming an intermediate substrate upon the first coating layer of the base substrate, the intermediate substrate having a pattern corresponding to the first concave pattern; and forming an offset printing substrate upon the pattern of the intermediate substrate, the offset printing substrate having a second concave pattern corresponding to the pattern of the intermediate substrate, the second concave pattern having a second width smaller than the first width.

2. The method of claim 1, wherein the forming an intermediate substrate further comprises:

forming a first intermediate substrate upon the first coating layer of the base substrate, so as to form a convex pattern on the first intermediate substrate, the convex pattern corresponding to the first concave pattern; and forming a second intermediate substrate upon the convex pattern of the first intermediate substrate, so as to form a third concave pattern on the second intermediate substrate, the third concave pattern corresponding to the convex pattern, the third concave pattern having a third width smaller than the first width.

3. The method of claim 2,
wherein the forming a first intermediate substrate further comprises coating a first high polymer on the first coating layer, and applying pressure to the first high polymer so as to harden the first high polymer; and
wherein the forming a second intermediate substrate further comprises coating a second high polymer on the first intermediate substrate, and applying pressure to the second high polymer so as to harden the second high polymer.

4. The method of claim 2, wherein the forming an offset printing substrate further comprises:
forming a second coating layer on the second intermediate substrate, so as to form a second concave pattern having the second width smaller than the third width.

5. The method of claim 4, wherein the second coating layer includes one of silicon oxide (SiO2) and nickel (Ni).

6. The method of claim 1, wherein the forming a first coating layer further comprises depositing one of oxide, nitride and metallic material.

7. The method of claim 1, wherein the forming a first coating layer further comprises depositing silicon nitride (SiNx).

8. A method of manufacturing a display substrate, the method comprising:
forming a first coating layer on a first base substrate on which is formed a first concave pattern having a first width;
forming an intermediate substrate upon the first coating layer of the base substrate, the intermediate substrate having a pattern corresponding to the first concave pattern;
forming an offset printing substrate upon the pattern of the intermediate substrate, the offset printing substrate having a second concave pattern corresponding to the pattern of the intermediate substrate, the second concave pattern having a width smaller than the first width;
forming a signal line on a second base substrate by using the offset printing substrate, the signal line corresponding to the second concave pattern; and
forming a pixel electrode to be electrically connected to the signal line.

9. The method of claim 8, wherein the forming a signal line further comprises:
forming a first signal pattern on a blanket by using the offset printing substrate, the first signal pattern corresponding to the second concave pattern and extending along a first direction on the blanket; and
transferring the first signal pattern onto the second base substrate, so as to form the first signal line.

10. The method of claim 9, wherein the forming a first signal pattern further comprises:
coating a first metallic material on a surface of the blanket;
pressing the surface of the blanket on which the first metallic material is coated against the offset printing substrate, so that a portion of the first metallic material contacts portions of the offset printing substrate besides the second concave pattern; and
transferring the portion of the first metallic material onto the offset printing substrate.

11. The method of claim 9, wherein the forming a first signal pattern further comprises:
injecting a first metallic material into the second concave pattern;
pressing the blanket against the offset printing substrate; and
transferring the first metallic material onto the blanket.

12. The method of claim 9, wherein the forming a signal line further comprises:
forming a second signal pattern on the blanket by using the offset printing substrate, the second signal pattern corresponding to the second concave pattern and extending along a second direction crossing the first direction; and
transferring the second signal pattern onto the second base substrate, so as to form the second signal line.

13. The method of claim 12, wherein the forming a second signal pattern further comprises:
coating a second metallic material on a surface of the blanket;
pressing the blanket on which the second metallic material is coated against the offset printing substrate, so that a portion of the second metallic material contacts portions of the offset printing substrate besides the second concave pattern; and
transferring the portion of the second metallic material onto the offset printing substrate.

14. The method of claim 12, wherein the forming a second signal pattern further comprises:
injecting a second metallic material into the second concave pattern;
pressing the blanket against the offset printing substrate; and
transferring the second metallic material onto the blanket.

15. The method of claim 8, wherein the forming an intermediate substrate further comprises:
forming a first intermediate substrate upon the first coating layer of the base substrate, so as to form a convex pattern on the first intermediate substrate, the convex pattern corresponding to the first concave pattern; and
forming a second intermediate substrate upon the convex pattern of the first intermediate substrate, so as to form a third concave pattern on the second intermediate substrate, the third concave pattern corresponding to the convex pattern, the third concave pattern having a third width smaller than the first width.

16. The method of claim 15, wherein the forming an offset printing substrate further comprises:
forming a second coating layer on the second intermediate substrate, so as to form a second concave pattern having the second width smaller than the third width.

* * * * *